United States Patent
Woo et al.

(10) Patent No.: US 11,183,553 B2
(45) Date of Patent: Nov. 23, 2021

(54) ORGANIC LIGHT-EMITTING DISPLAY DEVICE WITH SENSING LINES PARTIALLY OVERLAPPING A COMMON ELECTRODE

(71) Applicant: Samsung Display Co., Ltd., Yongin-si (KR)

(72) Inventors: Jun Hyuk Woo, Yongin-si (KR); Kwang Woo Park, Hwaseong-si (KR); Hyoeng Ki Kim, Suwon-si (KR); Eon Joo Lee, Hwaseong-si (KR); Jin Whan Jung, Yesan-gun (KR); Jeong Won Kim, Seoul (KR); Hyeon Bum Lee, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 36 days.

(21) Appl. No.: 16/175,730

(22) Filed: Oct. 30, 2018

(65) Prior Publication Data
US 2019/0245026 A1    Aug. 8, 2019

(30) Foreign Application Priority Data

Feb. 8, 2018   (KR) ........................ 10-2018-0015794

(51) Int. Cl.
*H01L 27/32*   (2006.01)
*G06F 3/044*   (2006.01)
(Continued)

(52) U.S. Cl.
CPC .......... *H01L 27/3276* (2013.01); *G06F 3/044* (2013.01); *G06F 3/0412* (2013.01);
(Continued)

(58) Field of Classification Search
CPC .............. H01L 27/3276; H01L 27/323; H01L 27/3272; H01L 51/5225; H01L 51/5284; G06F 3/0446
(Continued)

(56) References Cited

U.S. PATENT DOCUMENTS

2015/0049030 A1   2/2015  Her
2016/0170524 A1   6/2016  Kim et al.
(Continued)

FOREIGN PATENT DOCUMENTS

| CN | 107482128 A | 12/2017 |
|---|---|---|
| KR | 10-2017-0058281 A | 5/2017 |
| KR | 10-1741877 B1 | 5/2017 |

OTHER PUBLICATIONS

Extended European Search Report for corresponding European Patent Application No. 19156098.6, dated Jul. 25, 2019, 9 pages.

*Primary Examiner* — Robert T Huber
(74) *Attorney, Agent, or Firm* — Lewis Roca Rothgerber Christie LLP

(57) ABSTRACT

An organic light-emitting display device including: a substrate; a pixel electrode on the substrate; a pixel defining film on the pixel electrode and having a first opening at least partially exposing the pixel electrode; an organic light-emitting layer on the exposed portion of the pixel electrode; a common electrode on the organic light-emitting layer and the pixel defining film; an encapsulation layer on the common electrode; a black matrix on the encapsulation layer and having a second opening overlapping the first opening; and a plurality of first sensing lines on the black matrix and surrounding the pixel electrode in a plan view to define a pixel region. At least portions of the first sensing lines defining the pixel region do not overlap the common electrode in the pixel region to reduce the common electrode's
(Continued)

influence on the touch sensing lines and improve touch sensitivity.

22 Claims, 18 Drawing Sheets

(51) Int. Cl.
*H01L 51/52* (2006.01)
*G06F 3/041* (2006.01)

(52) U.S. Cl.
CPC .......... *G06F 3/0446* (2019.05); *H01L 27/323* (2013.01); *H01L 27/326* (2013.01); *H01L 27/3246* (2013.01); *H01L 27/3272* (2013.01); *H01L 51/5225* (2013.01); *H01L 51/5284* (2013.01); *G06F 2203/04112* (2013.01); *H01L 51/5253* (2013.01); *H01L 2251/558* (2013.01)

(58) Field of Classification Search
USPC ........................................ 257/40, 89, 91, 98
See application file for complete search history.

(56) References Cited

U.S. PATENT DOCUMENTS

| | | | |
|---|---|---|---|
| 2016/0300889 A1* | 10/2016 | Kim | ................... H01L 51/5284 |
| 2017/0090634 A1 | 3/2017 | Yang et al. | |
| 2017/0221972 A1 | 8/2017 | Yang et al. | |
| 2017/0250367 A1* | 8/2017 | Yasukawa | ........... H01L 51/5253 |
| 2017/0254935 A1* | 9/2017 | Shinsuke | ................ H01L 51/56 |
| 2017/0308199 A1 | 10/2017 | Liu et al. | |

* cited by examiner

FIG. 14

| Encapsulation Layer Height | Overlapping Area Ratio |||||||||||||||||||||||||||||||
|---|---|---|---|---|---|---|---|---|---|---|---|---|---|---|---|---|---|---|---|---|---|---|---|---|---|---|---|---|---|---|---|
| | 77.5 | 75 | 72.5 | 70 | 67.5 | 65 | 62.5 | 60 | 57.5 | 55 | 52.5 | 50 | 47.5 | 45 | 42.5 | 40 | 37.5 | 35 | 32.5 | 30 | 27.5 | 25 | 22.5 | 20 | 17.5 | 15 | 12.5 | 10 | 7.5 | 5 | 2.5 |
| 3.4 | 182% | 176% | 171% | 165% | 159% | 153% | 147% | 141% | 135% | 129% | 124% | 118% | 112% | 106% | 100% | 94% | 88% | 82% | 76% | 71% | 65% | 59% | 53% | 47% | 41% | 35% | 29% | 24% | 18% | 12% | 6% |
| 3.6 | 172% | 167% | 161% | 156% | 150% | 144% | 139% | 133% | 128% | 122% | 117% | 111% | 106% | 100% | 94% | 89% | 83% | 78% | 72% | 67% | 61% | 56% | 50% | 44% | 39% | 33% | 28% | 22% | 17% | 11% | 6% |
| 3.8 | 163% | 158% | 153% | 147% | 142% | 137% | 132% | 126% | 121% | 116% | 111% | 105% | 100% | 95% | 89% | 84% | 79% | 74% | 68% | 63% | 58% | 53% | 47% | 42% | 37% | 32% | 26% | 21% | 16% | 11% | 5% |
| 4 | 155% | 150% | 145% | 140% | 135% | 130% | 125% | 120% | 115% | 110% | 105% | 100% | 95% | 90% | 85% | 80% | 75% | 70% | 65% | 60% | 55% | 50% | 45% | 40% | 35% | 30% | 25% | 20% | 15% | 10% | 5% |
| 4.2 | 148% | 143% | 138% | 133% | 129% | 124% | 119% | 114% | 110% | 105% | 100% | 95% | 90% | 86% | 81% | 76% | 71% | 67% | 62% | 57% | 52% | 48% | 43% | 38% | 33% | 29% | 24% | 19% | 14% | 10% | 5% |
| 4.4 | 141% | 136% | 132% | 127% | 123% | 118% | 114% | 109% | 105% | 100% | 95% | 91% | 86% | 82% | 77% | 73% | 68% | 64% | 59% | 55% | 50% | 45% | 41% | 36% | 32% | 27% | 23% | 18% | 14% | 9% | 5% |
| 4.6 | 135% | 130% | 126% | 122% | 117% | 113% | 109% | 104% | 100% | 96% | 91% | 87% | 83% | 78% | 74% | 70% | 65% | 61% | 57% | 52% | 48% | 43% | 39% | 35% | 30% | 26% | 22% | 17% | 13% | 9% | 4% |
| 4.8 | 129% | 125% | 121% | 117% | 113% | 108% | 104% | 100% | 96% | 92% | 88% | 83% | 79% | 75% | 71% | 67% | 63% | 58% | 54% | 50% | 46% | 42% | 38% | 33% | 29% | 25% | 21% | 17% | 13% | 8% | 4% |
| 5 | 124% | 120% | 116% | 112% | 108% | 104% | 100% | 96% | 92% | 88% | 84% | 80% | 76% | 72% | 68% | 64% | 60% | 56% | 52% | 48% | 44% | 40% | 36% | 32% | 28% | 24% | 20% | 16% | 12% | 8% | 4% |
| 5.2 | 119% | 115% | 112% | 108% | 104% | 100% | 96% | 92% | 88% | 85% | 81% | 77% | 73% | 69% | 65% | 62% | 58% | 54% | 50% | 46% | 42% | 38% | 35% | 31% | 27% | 23% | 19% | 15% | 12% | 8% | 4% |
| 5.4 | 115% | 111% | 107% | 104% | 100% | 96% | 93% | 89% | 85% | 81% | 78% | 74% | 70% | 67% | 63% | 59% | 56% | 52% | 48% | 44% | 41% | 37% | 33% | 30% | 26% | 22% | 19% | 15% | 11% | 7% | 4% |
| 5.6 | 111% | 107% | 104% | 100% | 96% | 93% | 89% | 86% | 82% | 79% | 75% | 71% | 68% | 64% | 61% | 57% | 54% | 50% | 46% | 43% | 39% | 36% | 32% | 29% | 25% | 21% | 18% | 14% | 11% | 7% | 4% |
| 5.8 | 107% | 103% | 100% | 97% | 93% | 90% | 86% | 83% | 79% | 76% | 72% | 69% | 66% | 62% | 59% | 55% | 52% | 48% | 45% | 41% | 38% | 34% | 31% | 28% | 24% | 21% | 17% | 14% | 10% | 7% | 3% |
| 6 | 103% | 100% | 97% | 93% | 90% | 87% | 83% | 80% | 77% | 73% | 70% | 67% | 63% | 60% | 57% | 53% | 50% | 47% | 43% | 40% | 37% | 33% | 30% | 27% | 23% | 20% | 17% | 13% | 10% | 7% | 3% |
| 6.2 | 100% | 97% | 94% | 90% | 87% | 84% | 81% | 77% | 74% | 71% | 68% | 65% | 61% | 58% | 55% | 52% | 48% | 45% | 42% | 39% | 35% | 32% | 29% | 26% | 23% | 19% | 16% | 13% | 10% | 6% | 3% |

ORGANIC LIGHT-EMITTING DISPLAY DEVICE WITH SENSING LINES PARTIALLY OVERLAPPING A COMMON ELECTRODE

CROSS-REFERENCE TO RELATED APPLICATION

This application claims priority to and the benefit of Korean Patent Application No. 10-2018-0015794, filed on Feb. 8, 2018 in the Korean Intellectual Property Office, the entire content of which is hereby incorporated by reference.

BACKGROUND

1. Field

Aspects of embodiments of the present disclosure relate to an organic light-emitting display device.

2. Description of the Related Art

Display devices have become increasingly important following developments in multimedia technology. Accordingly, various types of display devices, such as a liquid crystal display (LCD) device, an organic light-emitting display device, etc., have been developed.

The organic light-emitting display device displays an image using organic light-emitting diodes (OLEDs), which generate light through the recombination of electrons and holes. The organic light-emitting display device has various features, such as fast response speed, high luminance, wide viewing angle, and low power consumption.

SUMMARY

Exemplary embodiments of the present disclosure provide an organic light-emitting display device having reducing reflectivity by modifying the width of openings in a black matrix.

Exemplary embodiments of the present disclosure also provide an organic light-emitting display device having a viewing angle of about 45° by modifying the height of an encapsulation layer in consideration of a reflectivity condition.

Exemplary embodiments of the present disclosure also provide an organic light-emitting display device that prevents or substantially mitigates a decrease in touch sensitivity by controlling the overlapping area ratio between a common electrode and an input sensing layer in consideration of reflectivity and viewing angle conditions.

However, exemplary embodiments of the present disclosure are not restricted or limited to the above-described aspects and features nor is the present disclosure limited to the exemplary embodiments set forth herein. Aspects and features of the present disclosure will become more apparent to one of ordinary skill in the art to which the present disclosure pertains by referencing the detailed description of the present disclosure given below.

According to an exemplary embodiment of the present disclosure, an organic light-emitting display device includes: a substrate; a pixel electrode on the substrate; a pixel defining film on the pixel electrode and having a first opening at least partially exposing the pixel electrode; an organic light-emitting layer on the exposed portion of the pixel electrode; a common electrode on the organic light-emitting layer and the pixel defining film; an encapsulation layer on the common electrode; a black matrix on the encapsulation layer and having a second opening overlapping the first opening; and a plurality of first sensing lines on the black matrix and surrounding the pixel electrode in a plan view to define a pixel region. At least portions of the first sensing lines defining the pixel region do not overlap the common electrode in the pixel region.

According to an exemplary embodiment of the present disclosure, an organic light-emitting display device includes a display panel for displaying an image and an input sensing layer on the display panel. The display panel includes: a substrate; a pixel electrode on the substrate; a pixel defining film having a first opening at least partially exposing the pixel electrode; a common electrode on the pixel defining film; an encapsulation layer on the common electrode; and a black matrix on the encapsulation layer and having a second opening overlapping the first opening. The input sensing layer includes a plurality of first sensing lines surrounding the pixel electrode in a plan view. The first sensing lines have first regions that overlap the common electrode and second regions that do not overlap the common electrode.

According to the aforementioned and other exemplary embodiments of the present disclosure, reflectivity can be reduced by controlling the width of openings of a black matrix.

Also, a viewing angle can be improved by controlling the height of an encapsulation layer in consideration of a reflectivity condition.

Also, the decrease of touch sensitivity can be reduced or prevented by controlling the overlapping area ratio between a common electrode and an input sensing layer in consideration of reflectivity and viewing angle conditions.

Other features and exemplary embodiments may be apparent from the following detailed description, the drawings, and the claims.

BRIEF DESCRIPTION OF THE DRAWINGS

The above and other aspects and features of the present disclosure will become more apparent by describing, in detail, exemplary embodiments thereof with reference to the attached drawings, in which:

FIG. 14 is a table showing relative static capacitance values for different encapsulation layer heights and for different overlapping area ratios.

DETAILED DESCRIPTION

Figure 1:
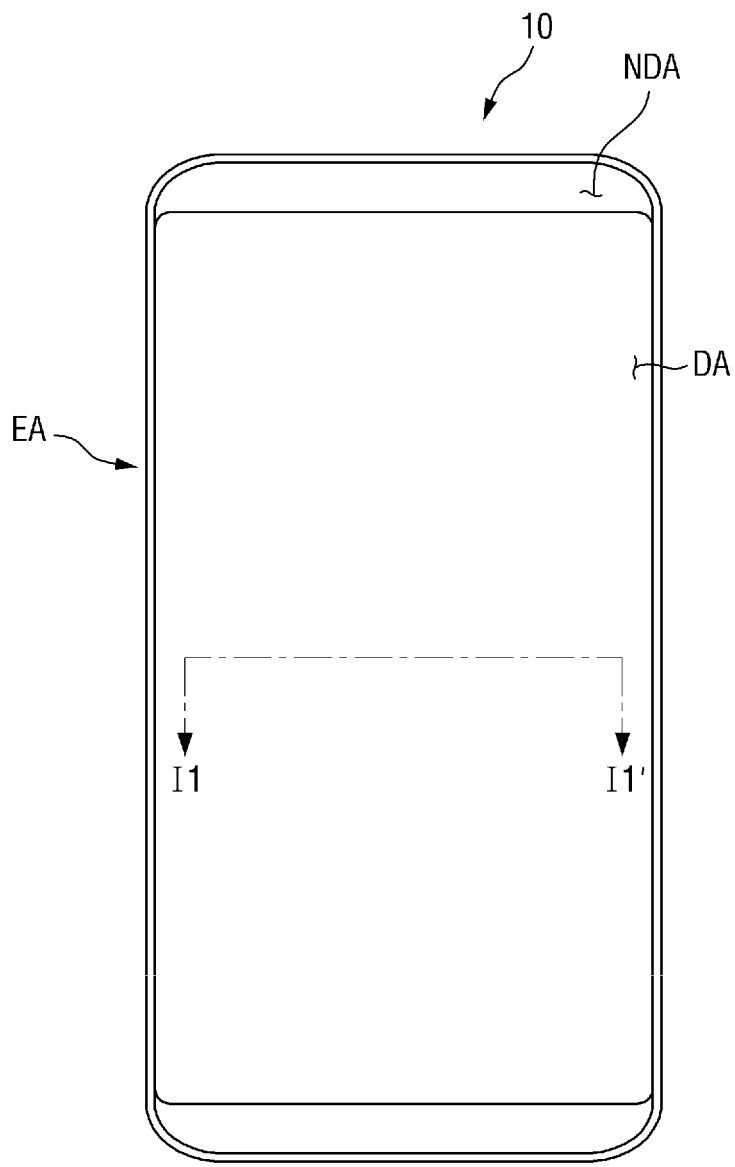
FIG. 1 is an organic light-emitting display device according to an exemplary embodiment of the present disclosure.

In the following description, for the purposes of explanation, various details are set forth to provide a thorough understanding of various exemplary embodiments. It will be apparent, however, that various exemplary embodiments may be practiced without these specific details or with one or more equivalent arrangements. In other instances, well-known structures and devices are shown in block diagram form in order to avoid unnecessarily obscuring aspects and features of various exemplary embodiments.

In the accompanying figures, sizes and relative sizes of layers, films, panels, regions, etc. may be exaggerated for clarity and descriptive purposes. Also, like reference numerals denote like elements. Further, the use of "may" when describing embodiments of the present invention relates to "one or more embodiments of the present invention."

When an element or layer is referred to as being "on," "connected to," or "coupled to" another element or layer, it may be directly on, connected to, or coupled to the other element or layer or intervening elements or layers may be present. When an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as only X, only Y, only Z, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, for example, to describe one element or feature's relationship to other element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and as such, the spatially relative descriptors used herein should be interpreted accordingly.

The terminology used herein is for the purpose of describing particular embodiments and is not intended to be limiting. As used herein, the singular forms, "a" and "an" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations due to, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, a region or area illustrated as a rectangle will, typically, have rounded or curved edges. Thus, the regions and areas illustrated in the drawings are schematic in nature, and their shapes are not intended to illustrate the actual shape of a region of a device and are not intended to be limiting.

Any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described with reference to the accompanying drawings.

FIG. 1 is a diagram of an organic light-emitting display device according to an exemplary embodiment of the present disclosure.

Referring to FIG. 1, an organic light-emitting display device 10 may include a display area DA and a non-display area NDA.

The non-display area DA is defined as an area in which an image is displayed. The display area DA may be used to detect an external environment. For example, the display area DA may be used to display an image or to recognize a fingerprint of a user. In one exemplary embodiment, the display area DA may be flat, but the present disclosure is not limited thereto. In other embodiments, the display area DA may be at least partially curved. The display area DA may be disposed in an edge area EA of the organic light-emitting display device 10. The edge area EA may include upper, lower, left, and right parts of the display area DA.

The non-display area NDA is disposed on the outside of (e.g., along a periphery of) the display area DA and is defined as an area in which no image is displayed. In one exemplary embodiment, a speaker module, a camera module, a sensor module, and the like may be provided in the non-display area NDA. In one exemplary embodiment, the sensor module may include at least one of an illumination sensor, a proximity sensor, an infrared (IR) sensor, and an ultrasonic sensor.

Figure 2:
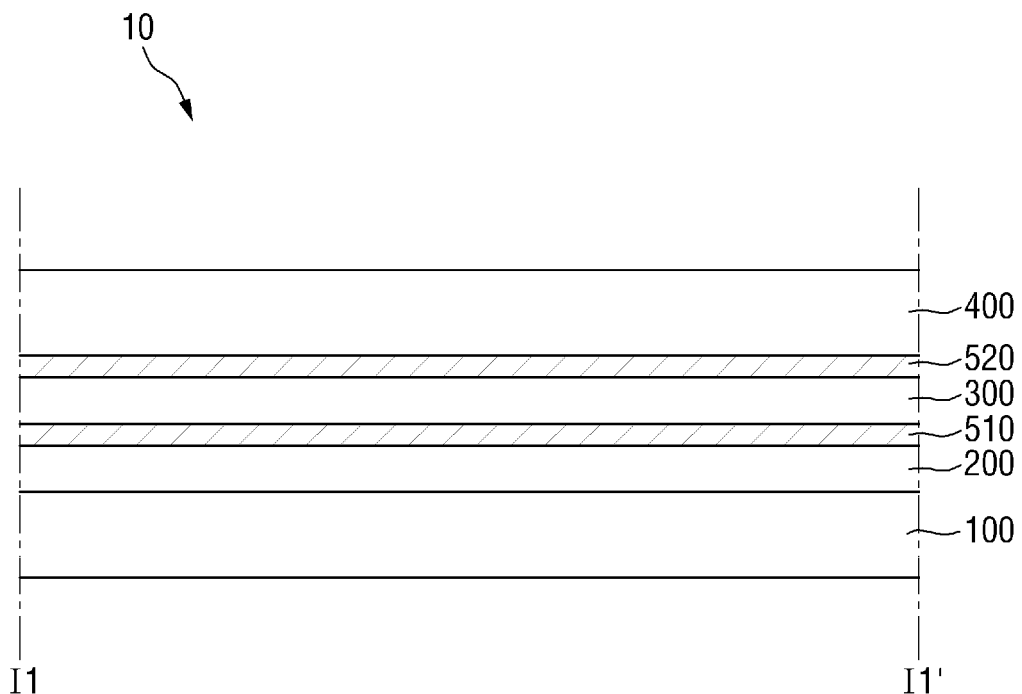
FIG. 2 is a cross-sectional view taken along the line I1-I1' of FIG. 1.

FIG. 2 is a cross-sectional view taken along the line I1-I1' of FIG. 1.

Referring to FIG. 2, an organic light-emitting display device 10 may include a display panel 100, an input sensing layer 200, an anti-reflection panel 300, and a window panel 400. An element coupled to another element via an adhesive member will hereinafter be referred to as a panel, and an element formed together with another element by a continuous process will hereinafter be referred to as a layer. A panel may include a base layer that provides a base surface, whereas a layer has no base layer. That is, a layer refers to an element disposed on a base surface of another element. In one exemplary embodiment, a base layer may be a single-layer film, such as a synthetic resin film or a composite film, or a multilayer film having a stack of a plurality of films. The base layer may include a glass substrate.

The display panel 100 is defined as a panel for displaying an image. The display panel 100 includes a plurality of display elements. The plurality of display elements may be organic light-emitting diodes (OLEDs).

In one exemplary embodiment, the input sensing layer 200 may sense a hand of the user or a touch pen. The input sensing layer 200 may be disposed on the display panel 100. The input sensing layer 200 may be formed on the display panel 100 by a continuous process.

The anti-reflection panel 300 may reduce the reflectance of external light incident thereupon from above the window panel 400. The anti-reflection panel 300 may be disposed on the input sensing layer 200 and may be coupled to the input sensing layer 200 via a first adhesive member 510. In one exemplary embodiment, the anti-reflection panel 300 may include a retarder and a polarizer. The anti-reflection panel 300 may further include a black matrix and color filters.

The window panel 400 may protect the display panel 100 and/or the input sensing layer 200 from being scratched. The window panel 400 may be disposed on the anti-reflection panel 300 and may be coupled to the anti-reflection panel 300 via a second adhesive member 520.

The first and second adhesive members 510 and 520 may be pressure sensitive adhesives (PSAs), optically clear adhesives (OCAs), or optically clear resins (OCRs).

In another embodiment different from that which is shown in FIG. 2, the anti-reflection panel 300 may be an anti-reflection layer, in which case the anti-reflection layer may be formed directly on the input sensing layer 200 without the aid of an additional adhesive member (e.g., when the anti-reflection layer is used in place of the anti-reflection panel 300, the first adhesive member 510 may be omitted).

The planar structure of the input sensing layer 200 will hereinafter be described with reference to FIG. 3.

Figure 3:
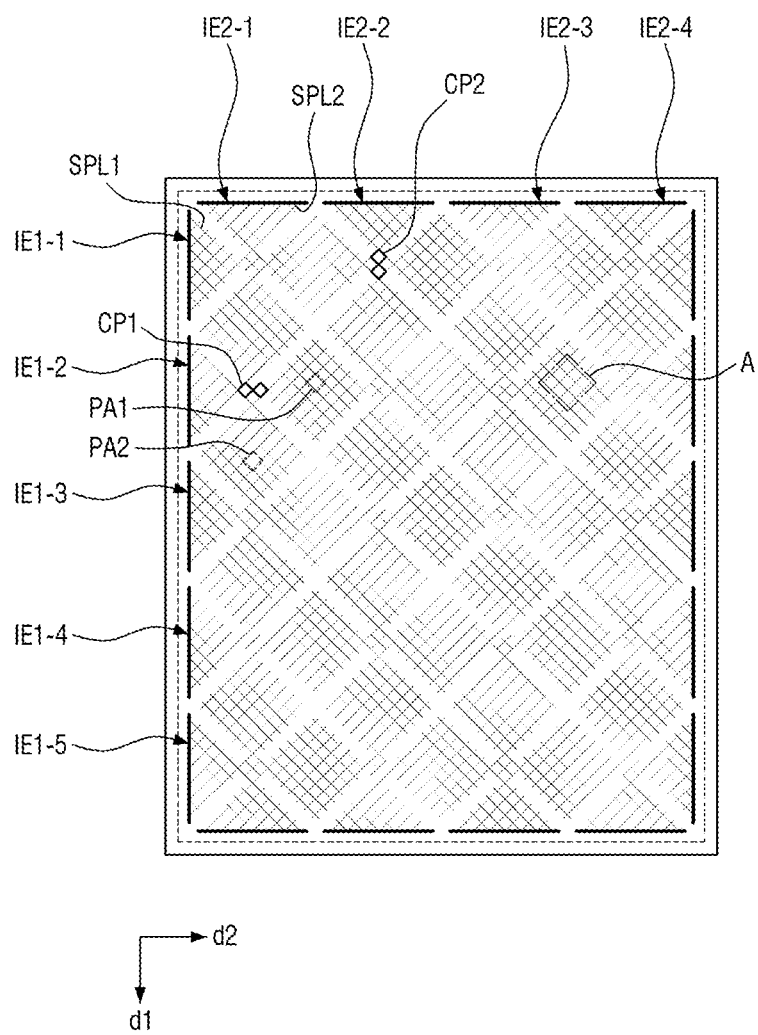
FIG. 3 is a plan view of an input sensing layer of FIG. 2.

FIG. 3 illustrates the planar shape of the input sensing layer 200 shown in FIG. 2.

Referring to FIG. 3, the input sensing layer 200 may include a plurality of first sensing electrodes IE1-1 through IE1-5 and a plurality of second sensing electrodes IE2-1 through IE2-4. The first sensing electrodes IE1-1 through IE1-5 may extend in a first direction d1. The second sensing electrodes IE2-1 through IE2-4 may extend in a second direction d2. In one exemplary embodiment, the first direction d1 may cross the second direction d2. In the example embodiment shown in FIG. 3, the first direction d1 may be a column direction, and the second direction d2 may be a row direction.

For example, each of the first sensing electrodes IE1-1 through IE1-5 may include (e.g., may be connected to) a plurality of first sensing lines SPL1, which are disposed to form a mesh shape. Areas PA1 defined by the first sensing lines SPL1 (e.g., defined by openings in the mesh shape of the first sensing lines SPL1) may overlap with organic light-emitting layers 150 shown in FIG. 6, which will be further described later. As used herein, the expression "first and second elements overlapping with each other" or "first and second elements overlap each other" means that the first and second elements overlap each other in a vertical direction with respect to a substrate 110 shown in FIG. 6. The input sensing layer 200 may further include a plurality of first connecting portions CP1, which electrically connect adjacent ones of the first sensing lines SPL1 to one another.

Each of the second sensing electrodes IE2-1 through IE2-4 may include a plurality of second sensing lines SPL2, which are disposed to form a mesh shape. Areas PA2 defined by the second sensing lines SPL2 (e.g., defined by openings in the mesh shape of the second sensing lines SPL2), like the areas PA1 defined by the first sensing lines SPL1, may overlap the organic light-emitting layers 150 shown in FIG. 6. The input sensing layer 200 may further include a plurality of second connecting portions CP2, which electrically connect adjacent ones of the second sensing lines SPL2 to one another.

In one exemplary embodiment, the areas PA1 defined by the first sensing lines SPL1 and the areas PA2 defined by the second sensing lines SPL2 may have a rhombus shape. As used herein, the term "rhombus shape" includes not only a substantially perfect rhomboid shape but also includes an almost or substantially rhomboid shape in consideration of processing conditions and the arrangement of the first sensing lines SPL1 and/or the second sensing lines SPL2.

The areas PA1 defined by the first sensing lines SPL1 are electrically insulated from the areas PA2 defined by the second sensing lines SPL2. In one exemplary embodiment, the first sensing lines SPL1 and the second sensing lines SPL2 may be disposed on the same layer, in which case, the first connecting portions CP1 may be disposed on a different layer than the second connecting portions CP2 and may be electrically insulated from the second connecting portions CP2. In another exemplary embodiment, the first sensing lines SPL1 may be disposed on a different layer from the second sensing lines SPL2.

The first sensing lines SPL1 and the second sensing lines SPL2 may include a conductive material. In one exemplary embodiment, the conductive material may be a low-resistance metal, such as silver (Ag), aluminum (Al), chromium (Cr), or nickel (Ni), or a conductive nanomaterial, such as silver (Ag) nanowires or carbon nanotubes.

The input sensing layer 200 may further include a signal pad unit, which provides signals to the first sensing electrodes IE1-1 through IE1-5 and the second sensing electrodes IE2-1 through IE2-4, and a plurality of signal lines.

The relationship between the elements of the display panel 100 and the elements of the input sensing layer 200 will hereinafter be further described with reference to FIGS. 4-7 using the area A of FIG. 3 as a reference. For convenience, the first sensing lines SPL1 and the second sensing lines SPL2 will hereinafter be described by using the first sensing lines SPL1 disposed in the area A as an example.

Figure 4:
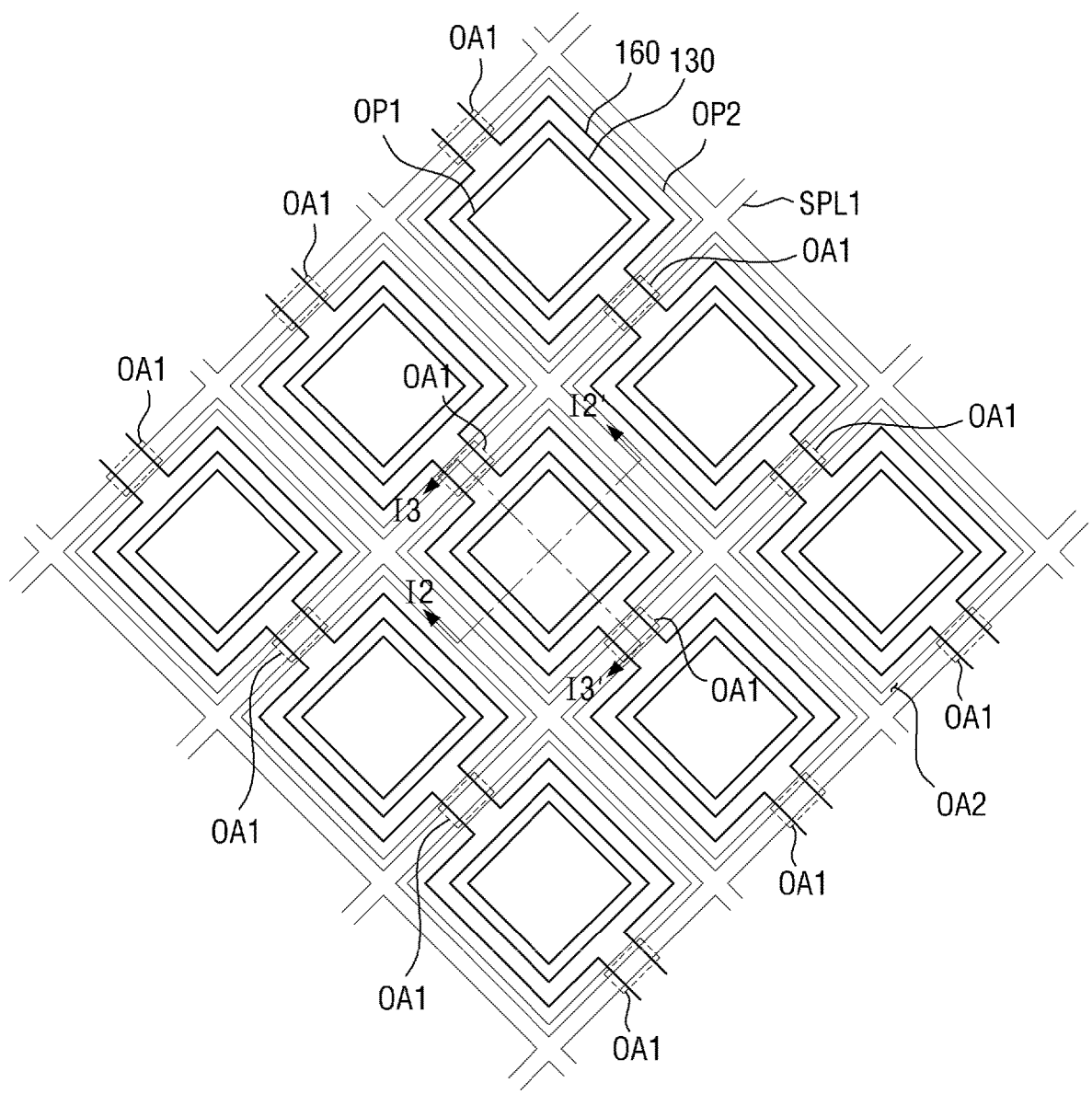
FIG. 4 is an enlarged plan view of the area A of FIG. 3.
Figure 5A:
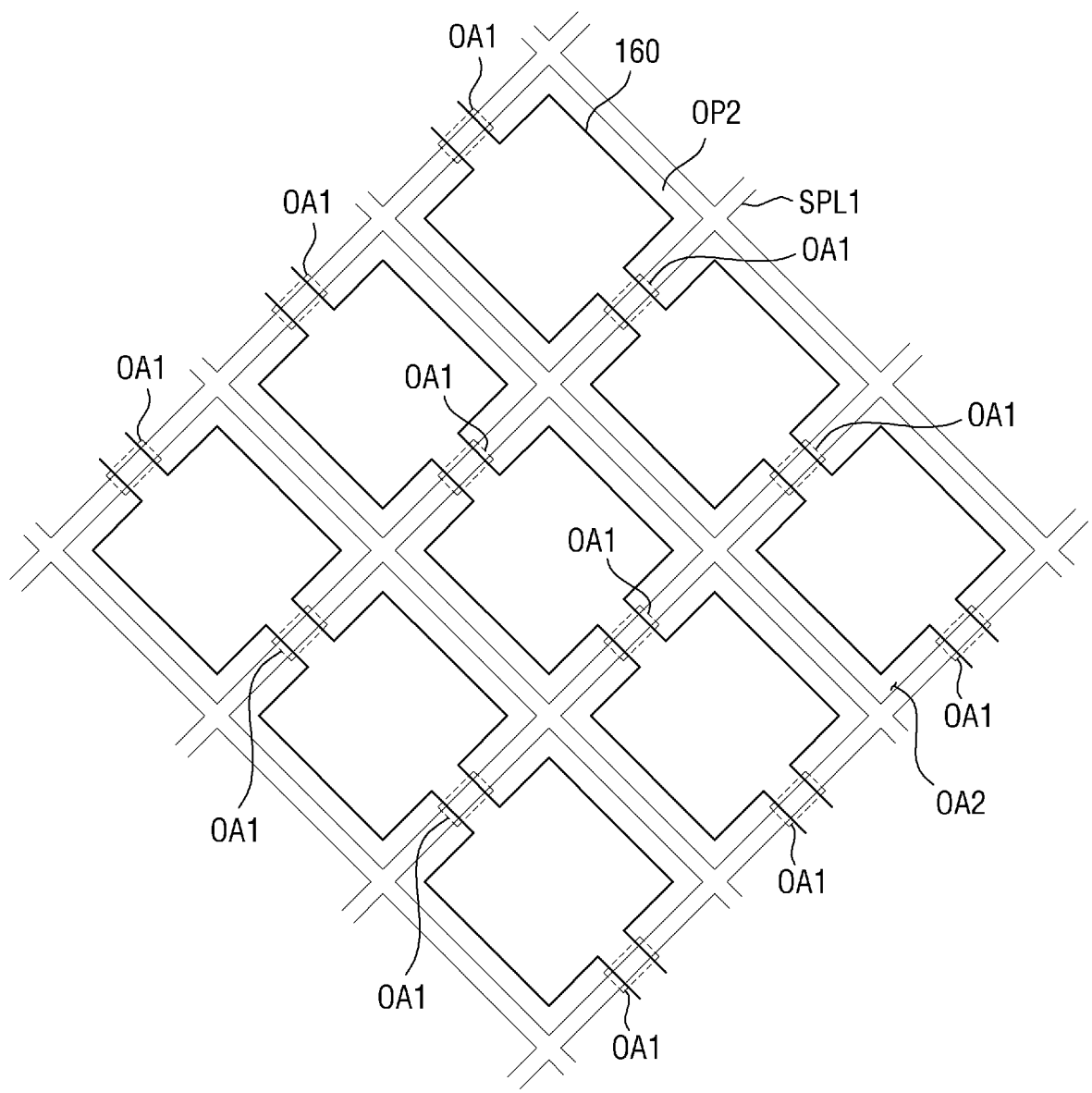
FIGS. 5A and 5B are plan views showing the layout of elements shown in FIG. 4.
Figure 5B:
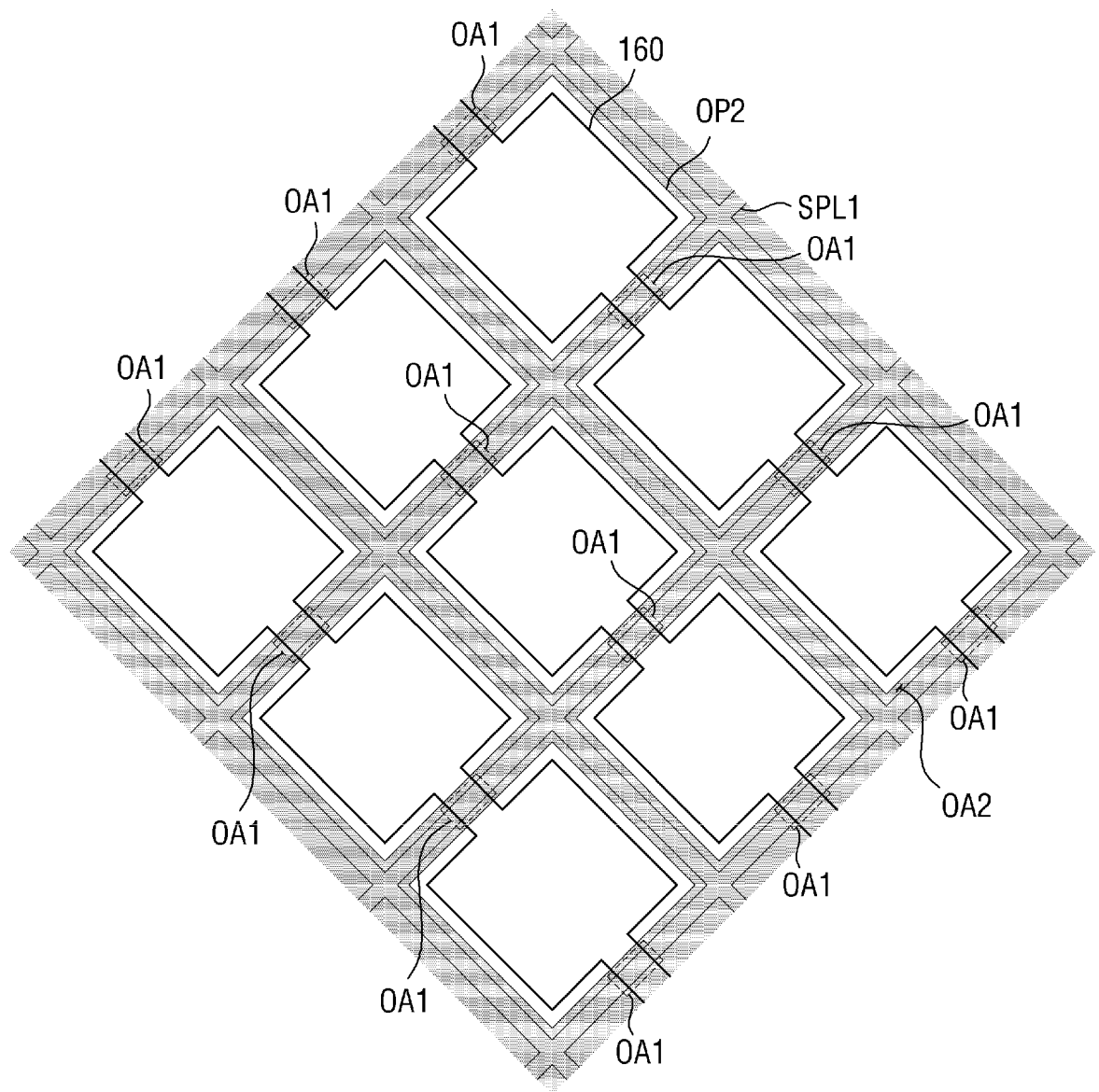
Figure 6:
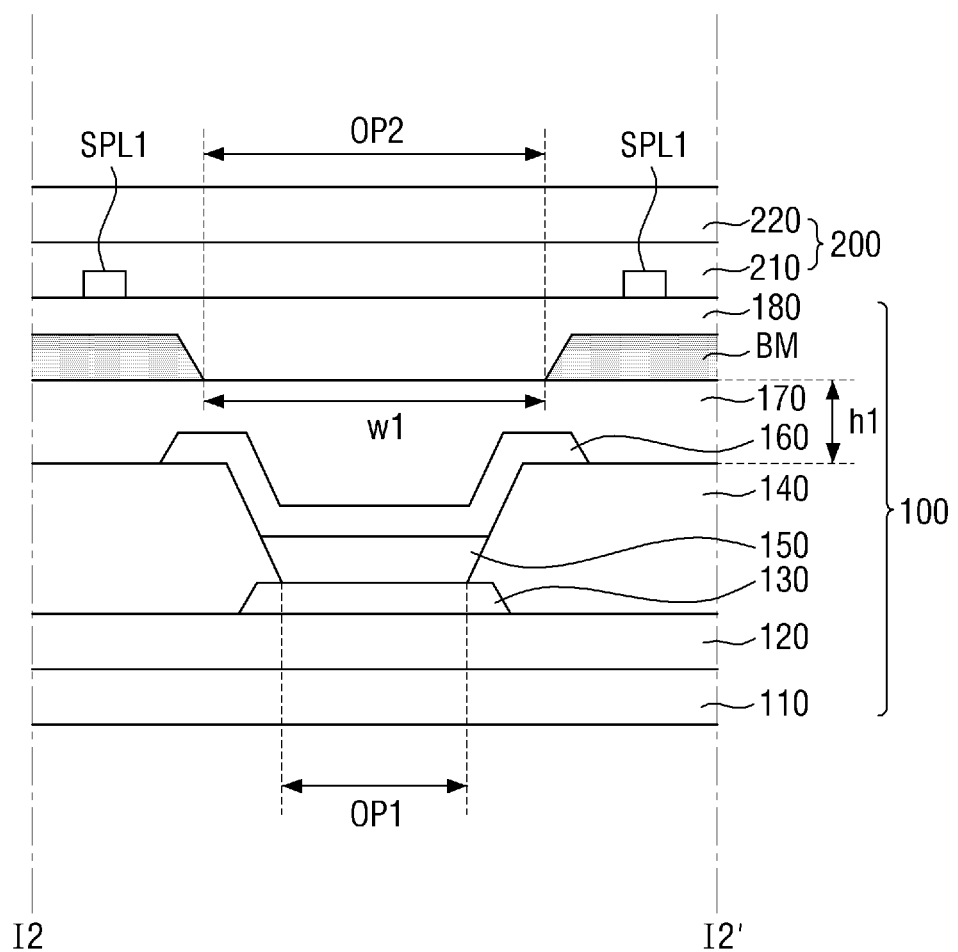
FIG. 6 is a cross-sectional view taken along the line I2-I2' of FIG. 4.
Figure 7:
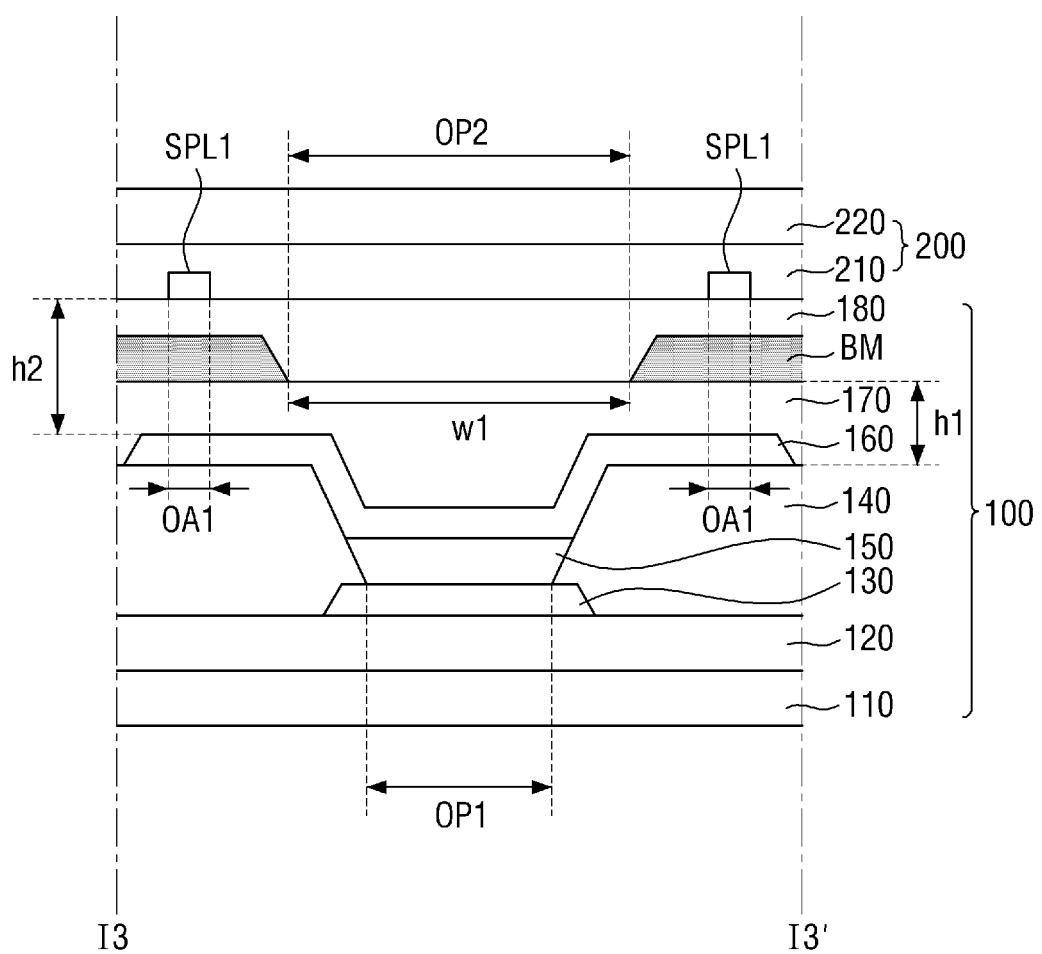
FIG. 7 is a cross-sectional view taken along the line I3-I3' of FIG. 4.

FIG. 4 is an enlarged plan view of the area A of FIG. 3. FIGS. 5A and 5B are plan views showing the layout of elements shown in FIG. 4. FIG. 6 is a cross-sectional view taken along the line I2-I2' of FIG. 4, and FIG. 7 is a cross-sectional view taken along the line I3-I3' of FIG. 4.

FIG. 5A illustrates only the first sensing lines SPL1 and a common electrode 160 from among the elements disposed in the area A, and FIG. 5B further illustrates a black matrix BM to the illustration of FIG. 5A. FIGS. 4-5B illustrate second openings OP2 in the black matrix BM for distinction with other elements.

The elements of the display panel 100 will hereinafter be described.

The display panel 100 may include the substrate 110, a via layer 120, a plurality of pixel electrodes 130, a pixel defining film 140, a plurality of organic light-emitting layers 150, a common electrode 160, and an encapsulation layer 170.

The substrate 110 may be an insulating substrate. In one exemplary embodiment, the substrate 110 may include a material, such as glass, quartz, or a polymer resin. The polymer resin may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyarylate, polycarbonate (PC), cellulose triacetate (CAT), cellulose acetate propionate (CAP), or a combination thereof.

In another exemplary embodiment, the substrate 110 may be a flexible substrate including polyimide (PI) and/or may have a stack of a plurality of films.

The via layer 120 may be disposed on the substrate 110. FIGS. 6 and 7 schematically illustrate the via layer 120 as a layer in which a buffer layer, a plurality of conductive wires, an insulating layer, and a plurality of thin-film transistors (TFTs) are disposed. That is, the via layer 120 may be a stack of a plurality of layers.

The plurality of thin film transistors (TFTs) may include (or be formed used) amorphous silicon, polysilicon, low-temperature polysilicon (LTPS), an oxide semiconductor, an organic semiconductor, or the like as their channel layer. The plurality of TFTs may have different types of channel layers. In one exemplary embodiment, a TFT including an oxide semiconductor and a TFT including LTPS may both be included in a single pixel unit in consideration of the functions of the TFTs or the order of processing.

The pixel electrodes 130 may be disposed on the via layer 120. In one exemplary embodiment, the pixel electrodes 130 may be anode electrodes. When the pixel electrodes 130 are anode electrodes, the pixel electrodes 130 may be transparent or translucent electrodes or may be formed of a reflective material, such as Al, Ag, Cr, or an alloy thereof. The transparent or translucent electrodes may include at least one selected from the group consisting of indium tin oxide (ITO), indium zinc oxide (IZO), zinc oxide (ZnO), indium oxide (In$_2$O$_3$), indium gallium oxide (IGO), and aluminum-doped zinc oxide (AZO). The reflective material may include at least one selected from the group consisting of Ag, magnesium (Mg), Cr, gold (Au), platinum (Pt), Ni, copper (Cu), tungsten (W), and Al.

In one exemplary embodiment, each of the pixel electrodes 130 may be a single film, but the present disclosure is not limited thereto. For example, each of the pixel electrodes 130 may be formed as a multilayer film having a stack of two or more materials.

When the pixel electrodes 130 are formed as multilayer films, each of the pixel electrodes 130 may include a reflective film and a transparent or translucent electrode disposed on the reflective film. In another exemplary embodiment, each of the pixel electrodes 130 may include a reflective film and a transparent or translucent electrode disposed below the reflective film. For example, the pixel electrodes 130 may have a triple-layer structure of ITO/Ag/ITO, but the present disclosure is not limited thereto.

The pixel defining film 140 may be disposed on the pixel electrodes 130. The pixel defining film 140 may include a plurality of openings, which at least partially expose the pixel electrodes 130. The pixel defining film 140 may include an organic material or an inorganic material. In one exemplary embodiment, the pixel defining film 140 may include a material, such as photoresist, a polyimide (PI) resin, an acrylic resin, a silicon compound, or a polyacrylic resin.

The organic light-emitting layers 150 may be disposed on the pixel electrodes 130 and the pixel defining film 140. In one exemplary embodiment, the organic light-emitting layers 150 may at least partially cover the sides of the pixel defining film 140.

In one exemplary embodiment, the organic light-emitting layers 150 may emit one of red light, blue light, and green light. In another exemplary embodiment, the organic light-emitting layers 150 may emit white light or one of cyan light, magenta light, and yellow light. When the organic light-emitting layers 150 emit white light, the organic light-emitting layers 150 may include a white-light-emitting material or may have a stack including a red-light-emitting layer, a green-light-emitting layer, and a blue-light-emitting layer. The organic light-emitting display device 10 may employ a front emission scheme in which light emitted from the organic light-emitting layers 150 is provided in an upward direction (in the example of FIGS. 5A and 5B). In other embodiments, the organic light-emitting display device 10 may employ a rear emission scheme or a both-side emission scheme (e.g., a top- and bottom-emission scheme).

The common electrode 160 may be disposed on the organic light-emitting layers 150 and the pixel defining film 140. The common electrode 160 may partially overlap the first sensing lines SPL1. The regions of overlap between the common electrode 160 and the first sensing lines SPL1 will hereinafter be referred to as overlapping regions OA1, and portions of the common electrode 160 that do not overlap the first sensing lines SPL1 will hereinafter be referred to as open regions OA2.

The common electrode 160 may be disposed on the organic light-emitting layers 150 and on the pixel defining film 140. In one exemplary embodiment, the common electrode 160 may be a cathode electrode. In one exemplary embodiment, the common electrode 160 may include at least one selected from the group consisting of lithium (Li), calcium (Ca), lithium fluoride/calcium (LiF/Ca), lithium fluoride/aluminum (LiF/Al), Al, Ag, and Mg. The common electrode 160 may be formed of a material having a low work function. In one exemplary embodiment, the common electrode 160 may be a transparent or translucent electrode including at least one selected from the group consisting of ITO, IZO, ZnO, $In_2O_3$, IGO, and AZO.

The pixel electrodes 130, the organic light-emitting layers 150, and the common electrode 160 may form OLEDs.

The encapsulation layer 170 may be disposed to face the substrate 110 and may cover the OLEDs. The encapsulation layer 170 may prevent or reduce the infiltration of moisture and air into the OLEDs.

The encapsulation layer 170 may be formed as a multilayer film including at least one organic layer and at least one inorganic layer. In one exemplary embodiment, the encapsulation layer 170 may include a first inorganic layer, which is disposed on the common electrode 160, an organic layer, which is disposed on the first inorganic layer, and a second inorganic layer, which is disposed on the organic layer. The first and second inorganic layers of the encapsulation layer 170 may include at least one selected from the group consisting of silicon oxide ($SiO_x$), silicon nitride ($SiN_x$), and silicon oxynitride ($SiON_x$). The organic layer of the encapsulation layer 170 may include at least one of an acrylic resin, a methacrylic resin, polyisoprene, a vinyl resin, an epoxy resin, a urethane resin, a cellulose resin, a siloxane resin, a PI resin, a polyamide resin, and a perylene resin.

In another exemplary embodiment, the encapsulation layer 170 may include a hexamethyldisiloxane (HMDSO) layer. When the encapsulation layer 170 includes the HMDSO layer, the organic layer of the encapsulation layer 170 may be replaced with the HMDSO layer. In one exemplary embodiment, the HMDSO layer may be formed in the same chamber as the first inorganic layer after the formation of the first inorganic layer. In this manner, the formation of the encapsulation layer 170 is simplified.

In another exemplary embodiment, the encapsulation layer 170 may be a transparent insulating substrate. The transparent insulating substrate may be a glass substrate, a quartz substrate, or a transparent resin substrate. When the encapsulation layer 170 is a transparent insulating substrate, the encapsulation layer 170 may be coupled to the substrate 110 via an additional sealing member.

The black matrix BM may be disposed on the encapsulation layer 170. The black matrix BM may be formed of a dark pigment or dye, such as a black pigment or dye, a gray pigment or dye, or a light-shielding material, such as photoresist. The black matrix BM may be disposed to overlap the first sensing lines SPL1 and the second sensing lines SPL2.

The black matrix BM may be formed on the entire encapsulation layer 170 and may have the second openings OP2 therein, which release light emitted by the organic light-emitting layers 150 outwardly (e.g., which allow light emitted by the organic light-emitting layers 150 to pass through the black matrix BM). A buffer layer may be further disposed between the black matrix BM and the encapsulation layer 170.

As already mentioned above, because the black matrix BM is formed on the entire encapsulation layer 170 and includes the second openings OP2, the black matrix BM may at least partially overlap the common electrode 160 and a plurality of conductive lines. Accordingly, the reflectivity of the organic light-emitting display device 10 is reduced. As used herein, the term "reflectivity" is defined as the ratio of the amount of light reflected by the elements of the organic light-emitting display device 10 that is emitted outwardly to the amount of external light provided to (e.g., incident on) the organic light-emitting display device 10 from the outside of the organic light-emitting display device 10. The relationship between the reflectivity of the organic light-emitting display device 10 and the second openings OP2 in the black matrix BM will be described later with reference to FIGS. 8-10.

A planarization layer 180 may be disposed on the black matrix BM to cover the black matrix BM. The planarization layer 180 may planarize a height difference formed by the black matrix BM (e.g., formed by the second openings OP2 in the black matrix BM). In one exemplary embodiment, the planarization layer 180 may be an organic layer. For example, the planarization layer 180 may include at least one of an acrylic resin, a methacrylic resin, polyisoprene, a vinyl resin, an epoxy resin, a urethane resin, a cellulose rein, a siloxane resin, a PI resin, a polyamide resin, and a perylene resin.

The first sensing lines SPL1 may be disposed on the planarization layer 180. The first sensing lines SPL1 may overlap the black matrix BM and the pixel defining film 140. When the first sensing lines SPL1 completely overlap the black matrix BM, the first sensing lines SPL1 may not be viewable to the user.

The first sensing lines SPL1 may overlap the common electrode 160 in the overlapping regions OA1, and the first sensing lines SPL1 may not overlap the common electrode 160 in areas other than the overlapping regions OA1, e.g., in the open regions OA2. This will be further described later with reference to FIGS. 8-10. The second sensing lines SPL2 and the first connecting portions CP1 may be further disposed on the planarization layer 180.

A first insulating layer 210 may be disposed on the first sensing lines SPL1 and the planarization layer 180. In one exemplary embodiment, the first insulating layer 210 may include an inorganic material. The inorganic material may include at least one selected from the group consisting of $SiO_x$, $SiN_x$, and $SiON_x$. In another exemplary embodiment, the first insulating layer 210 may include an organic material. The organic material may include at least one of an acrylic resin, a methacrylic resin, polyisoprene, a vinyl resin, an epoxy resin, a urethane resin, a cellulose rein, a siloxane resin, a PI resin, a polyamide resin, and a perylene resin.

A plurality of second connecting portions CP2, which electrically connect adjacent ones of the second sensing lines SPL2 to one another, may be disposed on the first insulating layer 210. The location of the first connecting portions CP1 and the location of the second connecting portions CP2 may be switched. For example, the second connecting portions CP2 may be disposed on the planarization layer 180, and the first connecting portions CP1 may be disposed on the first insulating layer 210. That is, the location of the first connecting portions CP1 and the location of the second connecting portions CP2 are not particularly limited as long as the first sensing lines SPL1 are electrically connected to one another by the first connecting portions CP1 and the second sensing lines SPL2 are electrically connected to one another by the second connecting portions CP2.

A second insulating layer 220 may be disposed on the first insulating layer 210. In one exemplary embodiment, the second insulating layer 220 may include an inorganic material or an organic material. Examples of the inorganic material or the organic material that may be used to form the second insulating layer 220 have been described above, and thus, a repeated description thereof is omitted. FIGS. 6 and 7 illustrate the first and second insulating layers 210 and 220 as being single layers, but the present disclosure is not limited thereto. In other embodiments, the first and second insulating layers 210 and 220 may each have a multilayer structure.

The reflectivity and the viewing angle of the organic light-emitting display device 10 and the touch sensitivity of the input sensing layer 200 will hereinafter be described based on a width w1 of the second openings OP2 in the black matrix BM, a height h1 of the encapsulation layer 170 (e.g., a height h1 from a top surface of the pixel defining film 140 to a top surface of the encapsulation layer 170), and the overlapping area ratio between the first sensing lines SPL1 and the common electrode 160.

First, the width w1 of the second openings OP2 in the black matrix BM and the reflectivity of the organic light-emitting display device 10 will be described.

Figure 8:
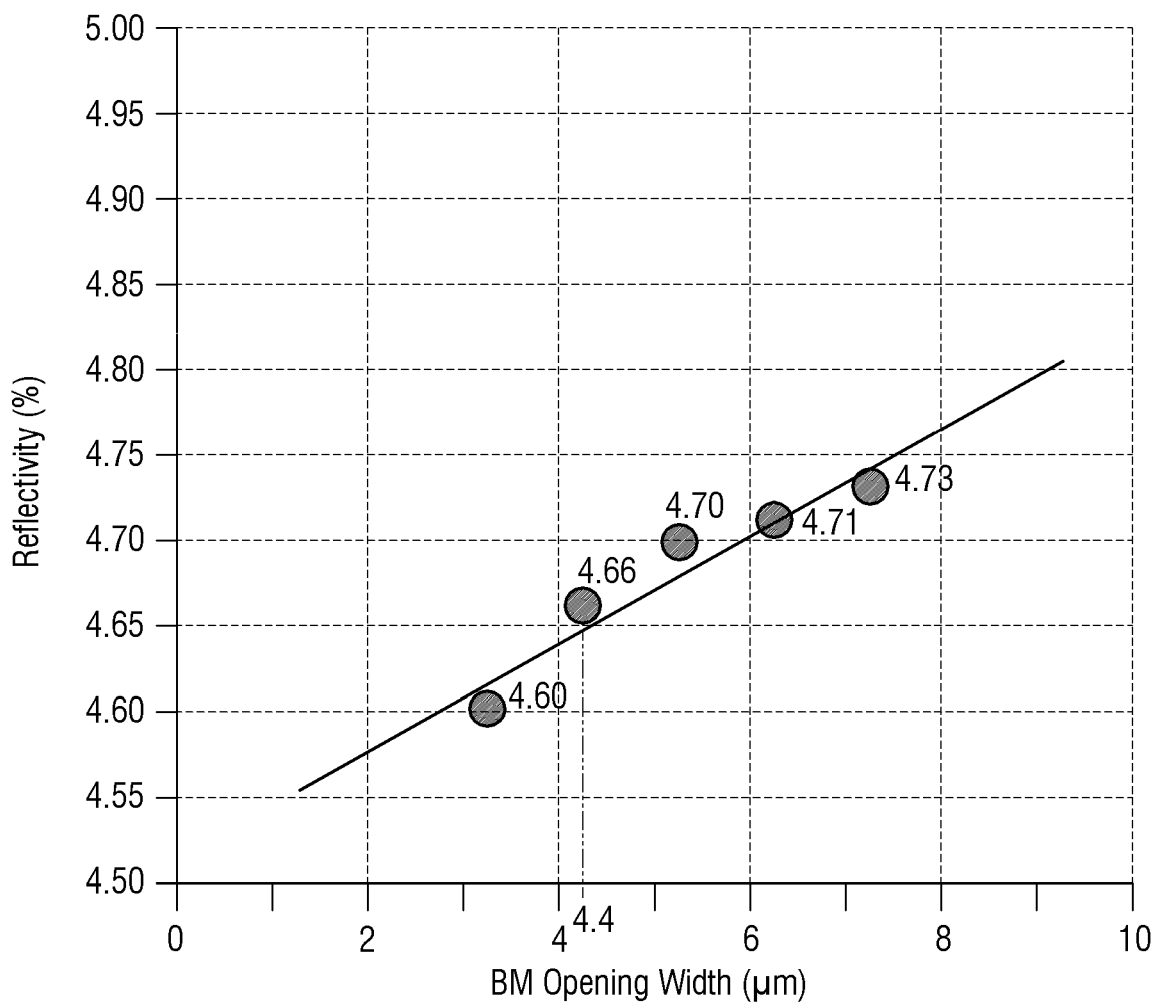
FIG. 8 is a graph showing the relationship between the reflectivity of an organic light-emitting display device and the width of openings in a black matrix.

FIG. 8 is a graph showing the relationship between the reflectivity of an organic light-emitting display device and the width of openings in a black matrix.

Referring to FIG. 8, as the width w1 of the second openings OP2 in the black matrix BM increases, the reflectivity of the organic light-emitting display device 10 increases.

As shown in FIG. 8, the reflectivity of the organic light-emitting display device 10 varies depending on the width w1 of the second openings OP2 in the black matrix BM. In other words, the reflectivity of the organic light-emitting display device 10 can be modified (or controlled) by adjusting the width w1 of the second openings OP2 in the black matrix BM.

The organic light-emitting display device 10 may be designed to have a reflectivity of about 4.66% or less. To this end, the second openings OP2 in the black matrix BM may be formed to have a width w1 of about 4.4 µm or less. If the reflectivity of the organic light-emitting display device 10 is too high, the degree of color separation of reflected light may increase, and as a result, visibility may be degraded. This will hereinafter be described with reference to FIGS. 9A and 9B.

Figure 9A:
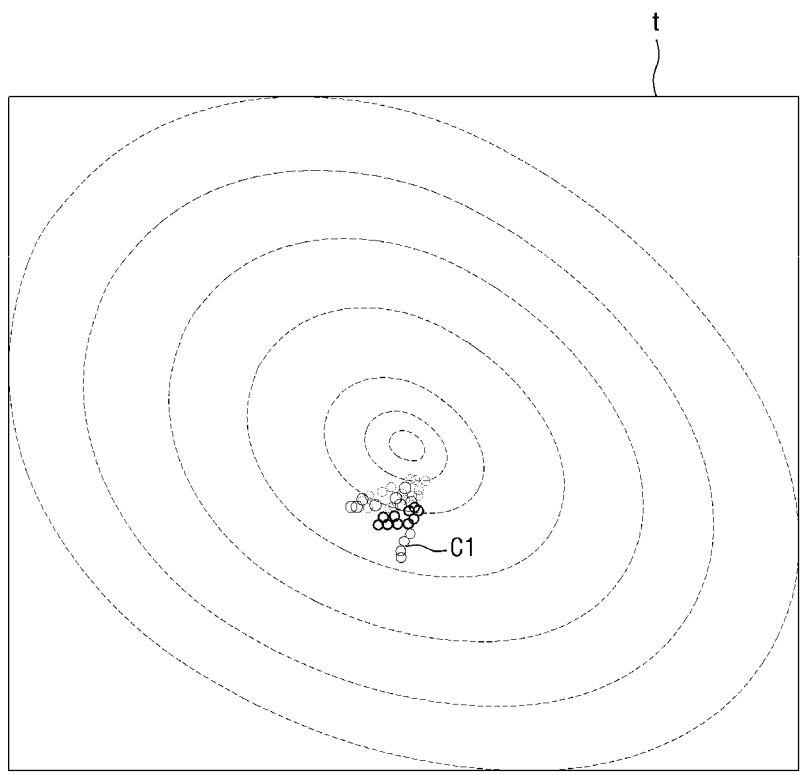
FIG. 9A is a graph showing the distribution of colors of light reflected from an organic light-emitting display device according to a comparative example.
Figure 9B:
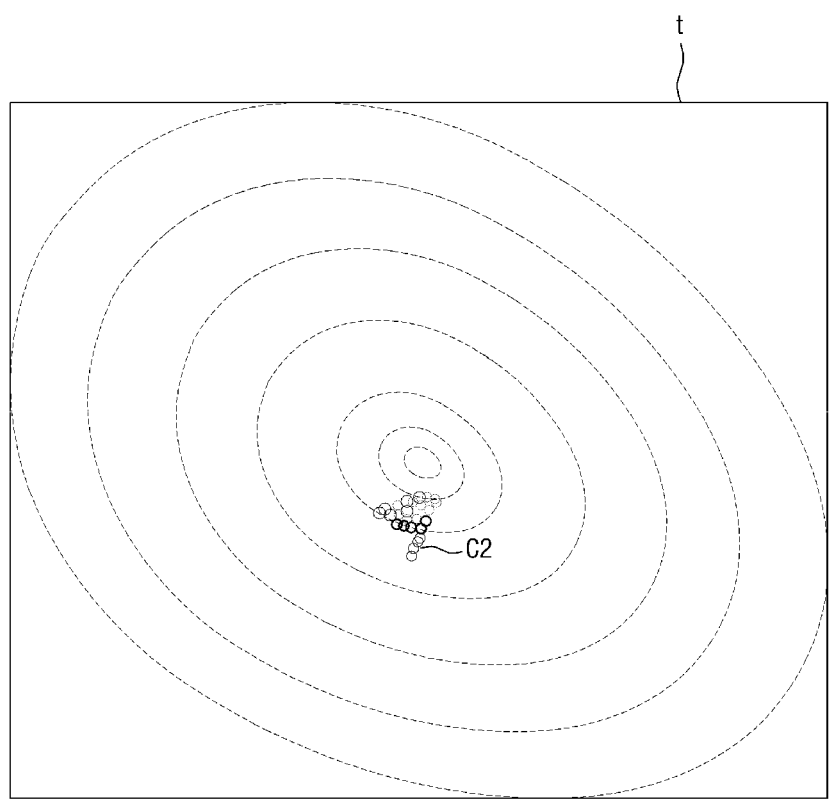
FIG. 9B is a graph showing the distribution of colors of light reflected from the organic light-emitting display device according to an exemplary embodiment of the present disclosure.

FIG. 9A shows the distribution of colors of reflected light from an organic light-emitting display device according to a comparative example. FIG. 9B shows the distribution of colors of reflected light from the organic light-emitting display device according to an exemplary embodiment of the present disclosure. FIG. 9A shows a comparative example in which the width of openings in a black matrix is about 7.2 µm and reflectivity is about 4.73%. On the other hand, FIG. 9B shows an embodiment of the present disclosure in which the width w1 of the second openings OP2 in the black matrix BM is about 4.4 µm and reflectivity is about 4.65%. That is, as already mentioned above, the reflectivity of the organic light-emitting display device 10 is lower than the reflectivity of the organic light-emitting display device according to the comparative example because the width w1 of the second openings OP2 in the black matrix BM is smaller in the organic light-emitting display device 10 than in the organic light-emitting display device according to the comparative example. Because the reflectivity of the organic light-emitting display device according to the comparative example is relatively high, the degree of color separation of light reflected by the organic light-emitting display device according to the comparative example may increase, and as a result, the visibility of the organic light-emitting display device according to the comparative example may be degraded.

The circles c2 of FIG. 9B are more uniformly distributed in the rectangle t than the circles c1 of FIG. 9A. The rectangle t represents color coordinates. Each of the circles c1 or c2 represents the color of reflected light at different inclination angles. When the circles c1 or c2 are uniformly distributed in the rectangle t, the color of reflected light is uniform, which means that the degree of color separation of reflected light is small. On the other hand, when the circles c1 or c2 are widely spread in the rectangle t, the degree of color separation of reflected light is large.

The degree of color separation of reflected light from the organic light-emitting display device according to the comparative example is greater than the degree of color separation of reflected light from the organic light-emitting display device 10. Thus, by reducing the reflectivity of the organic light-emitting display device 10, the degree of color separation of reflected light from the organic light-emitting display device 10 can be reduced as well, and as a result, the visibility of the organic light-emitting display device 10 is improved.

By forming the second openings OP2 in the black matrix BM to have a width w1 of about 4.4 µm or less, the reflectivity of the organic light-emitting display device 10 can be reduced to about 4.65% or less. As a result, the degree of color separation of reflected light from the organic light-emitting display device 10 can be reduced, and the visibility of the organic light-emitting display device 10 is improved.

The second openings OP2 in the black matrix BM may be formed to have a width w1 of about 3.0 µm or greater. As already mentioned above, the second openings OP2 in the black matrix BM are emission areas where light is emitted outwardly from the organic light-emitting layers 150. Thus, by forming the second openings OP2 in the black matrix BM to have a width w1 of about 3.0 µm or greater, sufficient emission areas can be secured.

In short, the width w1 of the second openings OP2 may be in a range of about 3.0 µm to about 4.4 µm. Accordingly, the organic light-emitting display device 10 may have a reflectivity of about 4.6% to about 4.65%. As the width w1 of the second openings OP2 in the black matrix BM decreases, the viewing angel of the organic light-emitting display device 10 also decreases.

The relationship between the viewing angle of the organic light-emitting display device 10 and the height h1 of the encapsulation layer 170 in the above-described reflectivity condition will hereinafter be described with reference to FIGS. 4-7, 10A, 10B, and 11.

Figure 10A:
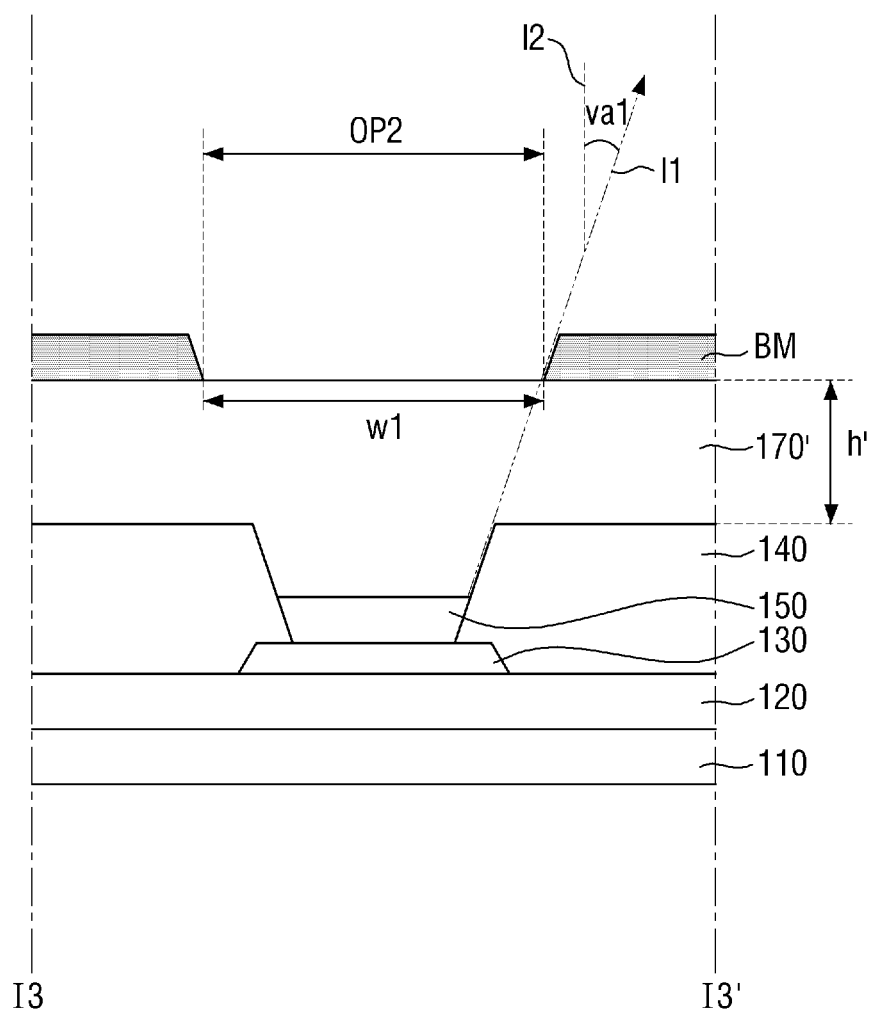
FIGS. 10A and 10B are cross-sectional views describing the relationship between the viewing angle of an organic light-emitting display device and the height of an encapsulation layer.
Figure 10B:
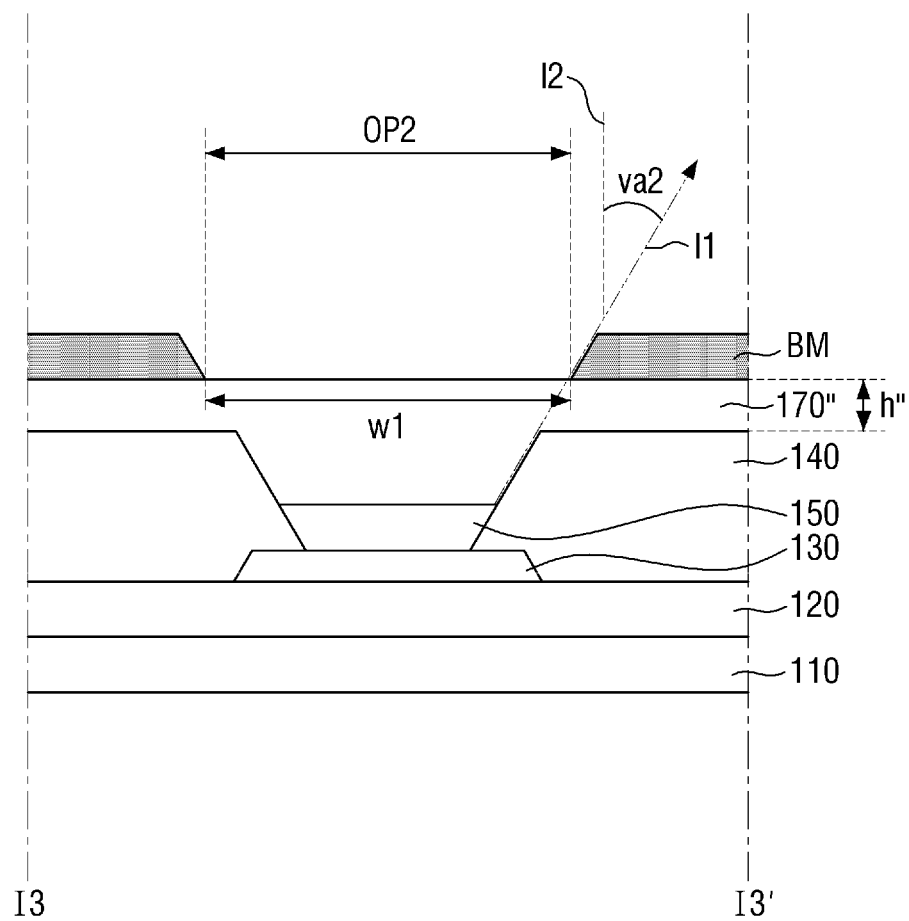

FIGS. 10A and 10B are cross-sectional views for explaining the relationship between the viewing angle of an organic light-emitting display device and the height of an encapsulation layer. For convenience, in FIGS. 10A and 10B, like reference numerals indicate like elements.

Referring to FIG. 10A, a viewing angle may be defined as the angle between an imaginary line I1 connecting one side of an organic light-emitting layer 150 and one side of a black matrix BM and an imaginary line I2 extending vertically from a substrate 110.

The organic light-emitting display device shown in FIG. 10A differs from the organic light-emitting display device shown in FIG. 10B in the height of an encapsulation layer 170' or 170". Specifically, a height h' of the encapsulation layer 170' shown in FIG. 10A is greater than a height h" of the encapsulation layer 170" shown in FIG. 10B. However, a width w1 of second openings OP2 in the black matrix BM is the same in both of the organic light-emitting display devices shown in FIGS. 10A and 10B.

Even when the width w1 of the second openings OP2 in the black matrix BM is the same in both the organic light-emitting display devices of FIGS. 10A and 10B, a viewing angle va1 of the organic light-emitting display device shown in FIG. 10A may be smaller than a viewing angle va2 of the organic light-emitting display device shown in FIG. 10B because the height h' of the encapsulation layer 170' shown in FIG. 10A is greater than the height h" of the encapsulation layer 170" shown in FIG. 10B. Thus, the viewing angle of the organic light-emitting display device 10 can be increased by reducing the height h1 of the encapsulation layer 170 shown in FIG. 6 in a given condition regarding the width w1 of the second openings OP2 in the black matrix BM (e.g., when the width w1 of the second openings OP2 in the black matrix BM remains constant).

Therefore, the viewing angle of the organic light-emitting display device 10 can be modified (or controlled) by adjusting the height h1 of the encapsulation layer 170 in the above-described reflectivity condition. In one exemplary embodiment, the organic light-emitting display device 10 may be formed to have a viewing angle of 45°. The organic light-emitting display device 10 will hereinafter be described as having a viewing angle of, for example, 45° (even though, in practice, the viewing angle may slightly vary from 45° due to manufacturing tolerances and the like). Referring to FIG. 6, the height of the encapsulation layer 170 is defined as the distance from the top surface of the pixel defining film 140 to the top surface of the encapsulation layer 170.

Figure 11:
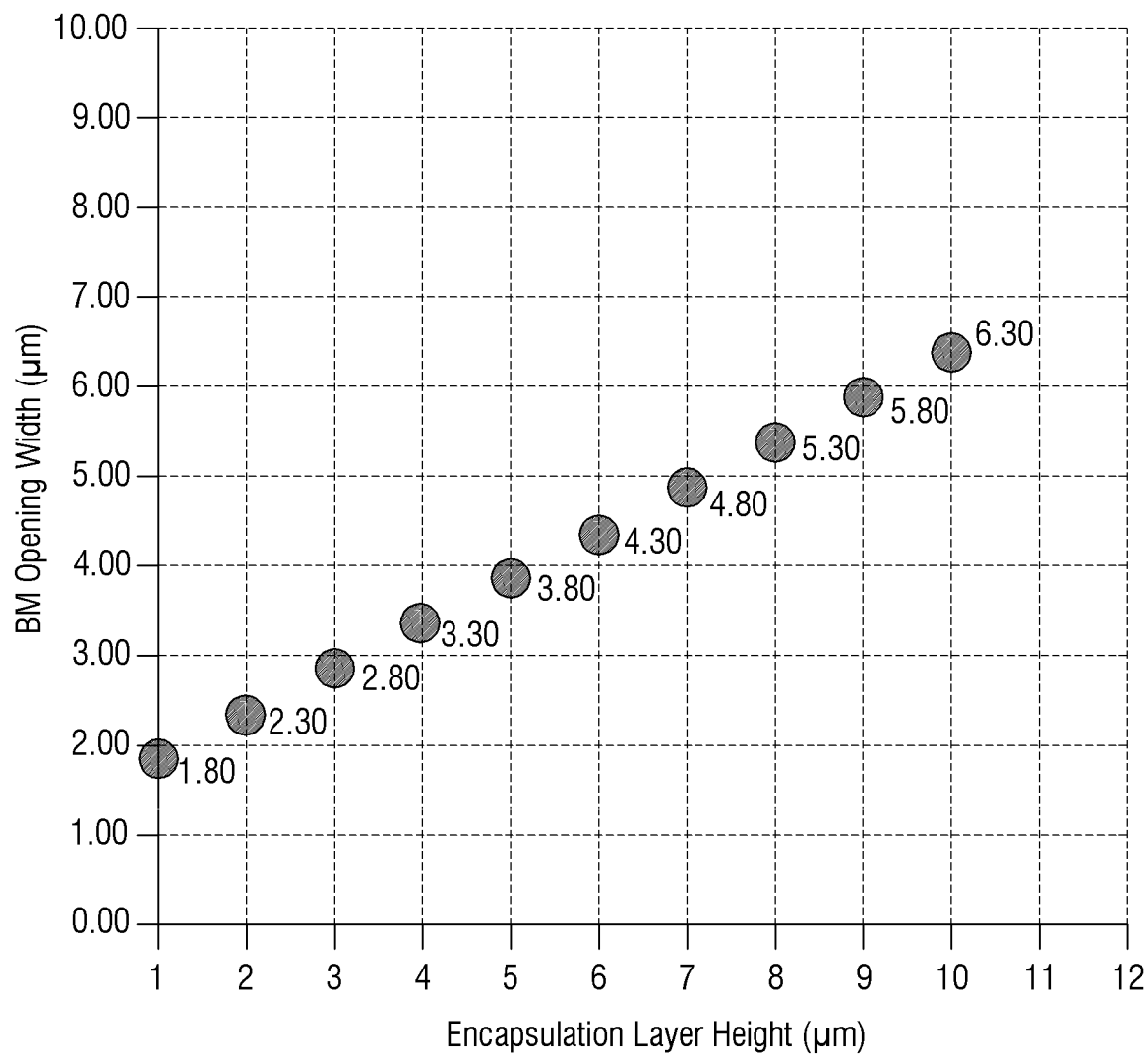
FIG. 11 is a graph showing the relationship between the width of openings in a black matrix and the height of an encapsulation layer when the viewing angle of an organic light-emitting display device is 45°.

FIG. 11 is a graph showing the relationship between the width of openings in a black matrix and the height of an encapsulation layer when the viewing angle of an organic light-emitting display device is 45°.

Referring to FIG. 11, the viewing angle of the organic light-emitting display device 10 can be modified (or controlled) by adjusting the width w1 of the second openings OP2 in the black matrix BM and the height h1 of the encapsulation layer 170. For example, the organic light-emitting display device 10 may be formed to have a viewing angle of about 45° when the height h1 of the encapsulation layer 170 is reduced in accordance with the decrease of the width w1 of the second openings OP2 in the black matrix BM.

As already mentioned above, the second openings OP2 in the black matrix BM may be formed to have a width w1 of about 3.0 μm to about 4.4 μm in consideration of a reflectivity condition. By forming the encapsulation layer 170 to have a height h1 of about 3.4 μm to about 6.2 μm in consideration of the width w1 of the second openings OP2 in the black matrix BM, the organic light-emitting display device 10 may be formed to have a viewing angle of about 45°.

The touch sensitivity of the input sensing layer 200 will hereinafter be described based on the height h1 of the encapsulation layer 170 and the overlapping area ratio between the first sensing lines SPL1 and the common electrode 160. In the description that follows, the first sensing lines SPL1 are used as a reference, but the following description may also be applicable to the second sensing lines SPL2.

As already mentioned above, when the height h1 of the encapsulation layer 170 is reduced, the viewing angle of the organic light-emitting display device 10 may be increased. However, referring to FIGS. 7 and 12, as the height h1 of the encapsulation layer 170 decreases, a distance h2 between the input sensing layer 200 (e.g., the first sensing lines SPL1) and the common electrode 160 decreases. As the distance h2 between the input sensing layer 200 and the common electrode 160 decreases, the influence of the common electrode 160 on the first sensing lines SPL1 considerably increases (e.g., increases exponentially). Thus, the touch sensitivity of the input sensing layer 200 may be reduced.

In the organic light-emitting display device 10, the overlapping area of the first sensing lines SPL1 and the common electrode 160 may be reduced by removing portions of the common electrode 160 (e.g., by forming the common electrode 160 to have open areas). In this manner, the touch sensitivity of the input sensing layer 200 may not be reduced or substantially reduced due to the influence of the common electrode 160.

The overlap of the first sensing lines SPL1 and the common electrode 160 will hereinafter be described with reference to FIGS. 12-14.

Figure 12:
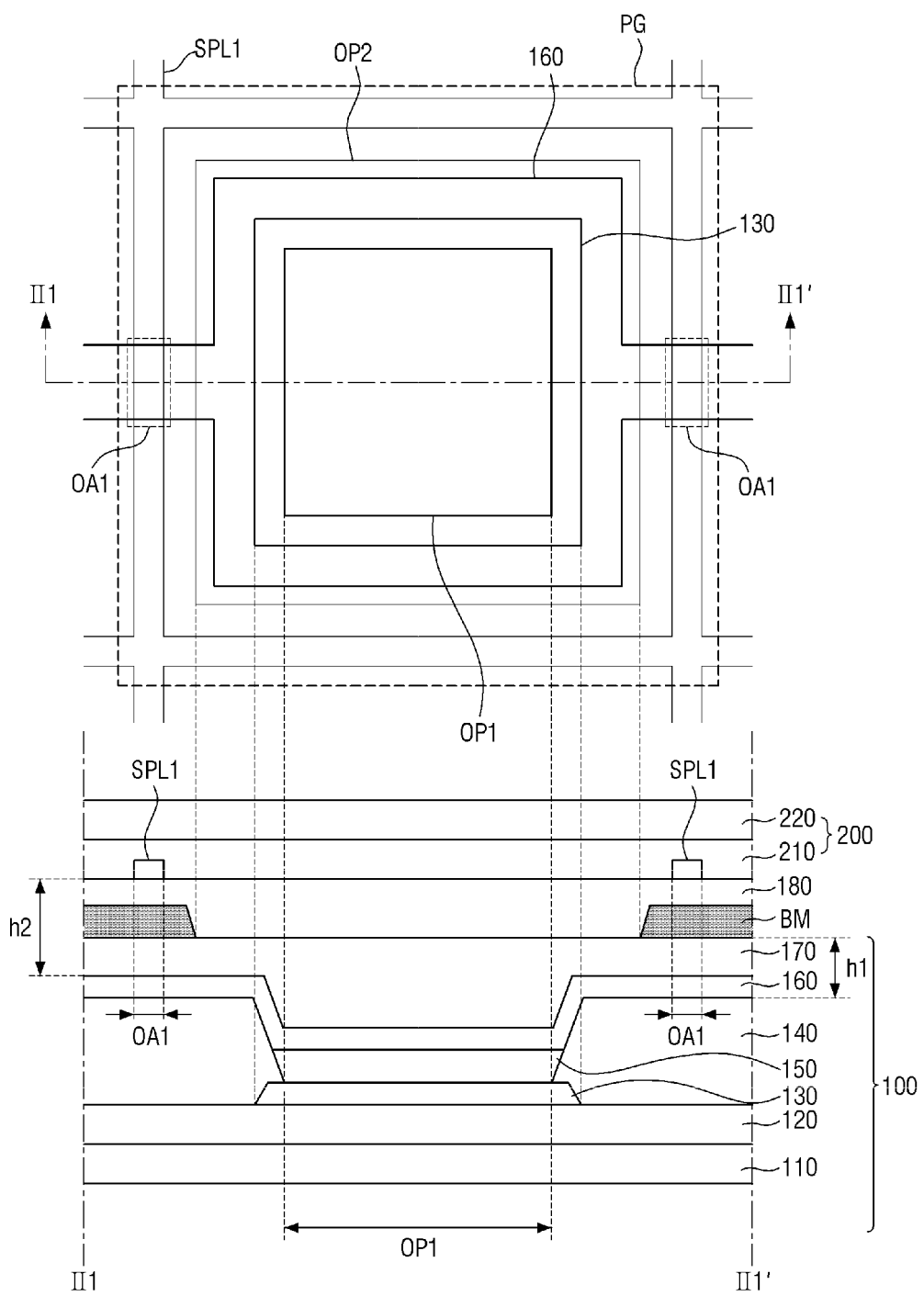
FIG. 12 shows a plan view of the area B of FIG. 4 and a cross-sectional view taken along the line II1-II1' of FIG. 12.
Figure 13:
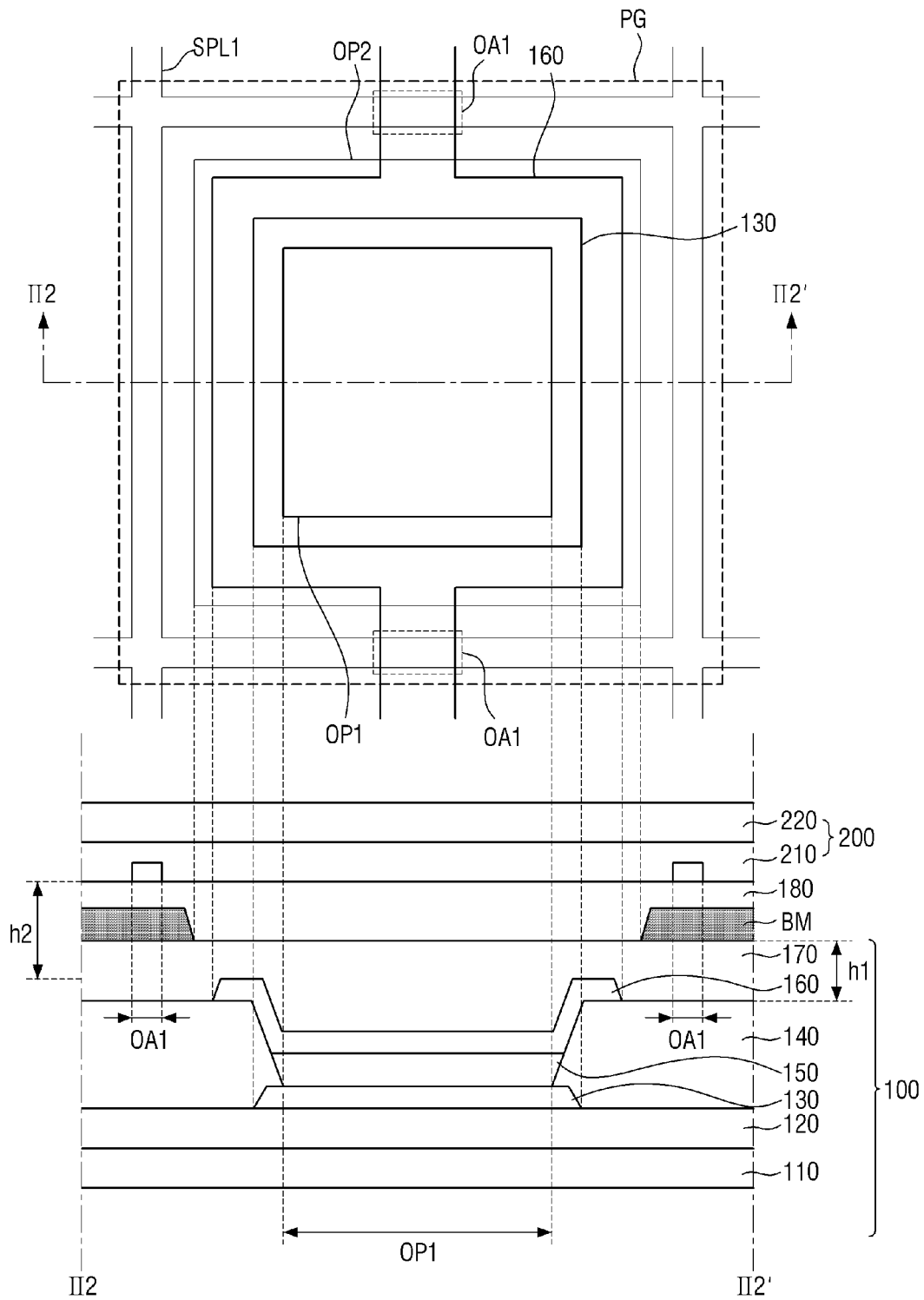
FIG. 13 shows a plan view of the area B of FIG. 4 and a cross-sectional view taken along the line II2-II2' of FIG. 13.

FIG. 12 shows a plan view of the area B of FIG. 4 and a cross-sectional view taken along the line II1-II1' of FIG. 12. FIG. 13 shows a plan view of the area B of FIG. 4 and a cross-sectional view taken along the line II2-II2' of FIG. 13. FIG. 14 is a table showing relative static capacitance values for different encapsulation layer heights and for different overlapping area ratios.

For convenience, referring to FIGS. 12 and 13, each rectangular area defined by the first sensing lines SPL1 will hereinafter be referred to as a pixel region PG, and four sides of the pixel region PG may substantially coincide with the sides of the first sensing lines SPL1 that define the pixel region PG. The pixel region PG illustrated in FIG. 12 and the pixel region PG illustrated in FIG. 13 are the same except for the direction in which they are arranged in a plan view.

Referring to FIG. 14, values less than 100% indicate an improved touch sensitivity with small static capacitance, and a value greater than 100% indicate a degraded touch sensitivity because of high static capacitance.

As already mentioned above, even when the distance h2 between the common electrode 160 and the first sensing lines SPL1 is reduced, a decrease of touch sensitivity can be prevented or reduced by reducing the overlapping regions OA1 between the common electrode 160 and the first sensing lines SPL1.

The area of the overlapping regions OA1 may be represented by the overlapping area ratio between first sensing lines SPL1 disposed in a pixel region PG and the common electrode 160. That is, the overlapping area ratio between the first sensing lines SPL1 and the common electrode 160 may be defined as the ratio by which first sensing lines SPL1 (or second sensing lines SPL2) disposed in each pixel region PG overlap the common electrode 160. For example, the overlapping area ratio between the first sensing lines SPL1 and the common electrode 160 may be 100% when the first sensing lines SPL1 completely overlap the common electrode 160 in each pixel region PG. On the other hand, the overlapping area ratio between the first sensing lines SPL1 and the common electrode 160 may be 0% when the first sensing lines SPL1 do not overlap the common electrode 160 in each pixel region PG.

Because portions of the common electrode 160 need to be electrically connected, the common electrode 160 may not be arranged in an island-like manner. Also, because a common voltage is applied to the common electrode 160, resistance may not be considered. Accordingly, the overlapping area ratio between the first sensing lines SPL1 and the common electrode 160 can be set to about 2.5% or greater.

As already mentioned above, the encapsulation layer 170 may be formed to have a height h1 of about 3.4 μm to about 6.2 μm in consideration of the width w1 of the second openings OP2 in the black matrix BM and the viewing angle of the organic light-emitting display device 10.

Referring to FIG. 14, the overlapping area ratio between the first sensing lines SPL1 and the common electrode 160 may be set to about 2.5% to about 77.5% in consideration of conditions regarding the height h1 of the encapsulation layer 170 and a minimum overlapping area ratio. For example, when the height h1 of the encapsulation layer 170 is about 3.4 μm, the overlapping area ratio between the first sensing lines SPL1 and the common electrode 160 may be set to about 2.5% to about 42.5%. Also, when the height h1 of the encapsulation layer 170 is about 6.2 μm, the overlapping area ratio between the first sensing lines SPL1 and the common electrode 160 may be set to about 2.5% to about 77.5%.

The overlapping area ratio between the first sensing lines SPL1 and the common electrode 160 has been described above using a single pixel region PG as a reference, but the overlapping area ratio may be set to about 2.5% to about 77.5% in all of the pixel regions PG.

Thus, even when the height h1 of the encapsulation layer 170 is reduced in consideration of the viewing angle of the organic light-emitting display device 10, a decrease of touch sensitivity can be prevented or reduced by removing at least a portion of the common electrode 160 that overlaps with the first sensing lines SPL1. A method to form the common electrode 160 is not particularly limited. In one exemplary embodiment, the common electrode 160 may be formed by a fine metal mask (FMM) process.

In one exemplary embodiment, two overlapping regions OA1 are provided in one pixel region PG, but the present disclosure is not limited thereto. This will hereinafter be described with reference to FIG. 15.

Figure 15:
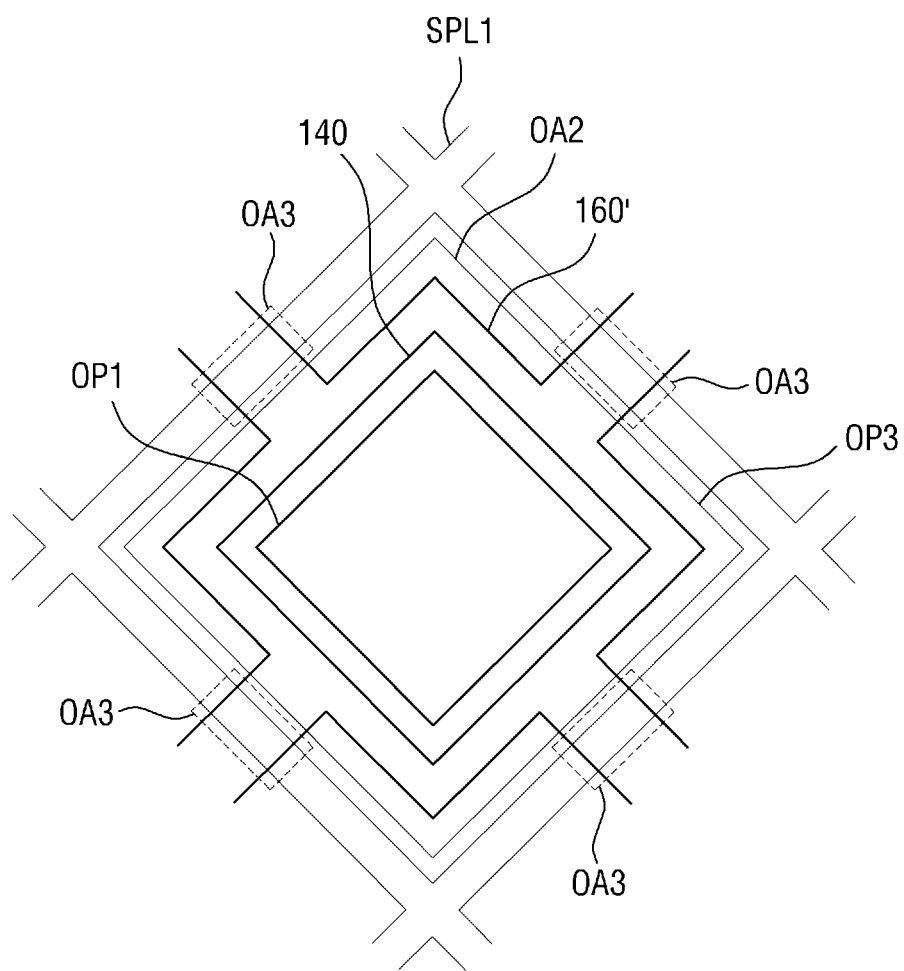
FIG. 15 is a plan view illustrating a pixel region of an organic light-emitting display device according to another exemplary embodiment of the present disclosure.

FIG. 15 is a plan view illustrating a pixel region of an organic light-emitting display device according to another exemplary embodiment of the present disclosure.

Referring to FIG. 15, the number of overlapping regions OA3 between a plurality of first sensing lines SPL1 and a common electrode 160' is not particularly limited. For example, four overlapping regions OA3 may be provided between the first sensing lines SPL1 and the common electrode 160' in one pixel region PG.

That is, the locations, the number, and the shape of the overlapping regions OA3 are not particularly limited as long as the overlapping area ratio between the first sensing lines SPL1 and the common electrode 160' falls within the range of about 2.5% to about 77.5%.

What is claimed is:

1. An organic light-emitting display device comprising:
a substrate;
a plurality of pixel electrodes on a surface of the substrate;
a pixel defining film on the pixel electrodes and having first openings at least partially exposing the pixel electrodes;
an organic light-emitting layer on the exposed portion of the pixel electrodes;
a common electrode on the organic light-emitting layer and the pixel defining film, the common electrode comprising a plurality of body portions over the pixel electrodes and integral connecting portions extending between adjacent ones of the body portions over the pixel defining film;
an encapsulation layer on the common electrode;
a black matrix on the encapsulation layer and having second openings overlapping the first openings; and
a plurality of first sensing lines on the black matrix and surrounding the pixel electrode in a plan view to define a pixel region, at least portions of the first sensing lines defining the pixel region do not overlap the common electrode in the pixel region,
wherein the adjacent ones of the body portions are adjacent to each other in a first direction, and
wherein a width of the connecting portions in a second direction perpendicular to the first direction is smaller than a width of the body portions in the second direction, the first and second directions being parallel to the surface of the substrate.

2. The organic light-emitting display device of claim 1, wherein a width of the second openings in the black matrix is in a range of 3.0 μm to 4.4 μm.

3. The organic light-emitting display device of claim 1, wherein a height of the encapsulation layer is in a range of 3.4 μm to 6.2 μm.

4. The organic light-emitting display device of claim 1, wherein an overlapping area ratio between the first sensing lines and the common electrode is in a range of 2.5% to 77.5%.

5. The organic light-emitting display device of claim 1, wherein, in the pixel region, the first sensing lines and the common electrode overlap each other at a plurality of regions.

6. The organic light-emitting display device of claim 1, wherein the black matrix is directly on the encapsulation layer.

7. The organic light-emitting display device of claim 1, wherein the black matrix completely overlaps the first sensing lines.

8. The organic light-emitting display device of claim 1, wherein the encapsulation layer comprises at least one of an organic layer and at least one of an inorganic layer.

9. The organic light-emitting display device of claim 1, wherein the first sensing lines are arranged in a mesh shape.

10. The organic light-emitting display device of claim 1, wherein an angle between a first imaginary line connecting one side of the organic light-emitting layer to one side of the second openings in the black matrix and a second imaginary line extending vertically from the surface of the substrate is 45°.

11. The organic light-emitting display device of claim 1, wherein a first region is defined as a region in which a first sensing line of the plurality of first sensing lines and the common electrode overlap each other,
wherein a second region is defined as a region in which the first sensing line does not overlap the common electrode, and
wherein the first region overlaps the black matrix.

12. An organic light-emitting display device comprising:
a display panel for displaying an image, the display panel comprising:
a substrate;
a plurality of pixel electrodes on a surface of the substrate;
a pixel defining film having first openings at least partially exposing the pixel electrodes;
a common electrode on the pixel defining film, the common electrode comprising a plurality of body portions over the pixel electrodes and integral connecting portions extending between adjacent ones of the body portions over the pixel defining film;
an encapsulation layer on the common electrode; and a black matrix on the encapsulation layer and having second openings overlapping the first openings; and an input sensing layer on the display panel, the input sensing layer comprising a plurality of first sensing lines surrounding the pixel electrodes in a plan view, the first sensing lines having first regions that overlap the common electrode and second regions that do not overlap the common electrode, wherein the adjacent ones of the body portions are adjacent to each other in a first direction, and wherein a width of the connecting portions in a second direction perpendicular to the first direction is smaller than a width of the body portions in the second direction, the first and second directions being parallel to the surface of the substrate.

13. The organic light-emitting display device of claim 12, wherein a width of the second openings in the black matrix is in a range of 3.0 μm to 4.4 μm.

14. The organic light-emitting display device of claim 12, wherein a distance from a top surface of the pixel defining film to a top surface of the encapsulation layer is in a range of 3.4 μm to 6.2 μm.

15. The organic light-emitting display device of claim 12, wherein, in a pixel region defined by the first sensing lines, an overlapping area ratio between the first sensing lines and the common electrode is in a range of 2.5% to 77.5%.

16. The organic light-emitting display device of claim 15, wherein there are a plurality of the first regions in the pixel region.

17. The organic light-emitting display device of claim 12, wherein the input sensing layer is directly on the display panel.

18. The organic light-emitting display device of claim 12, wherein the first sensing lines are arranged in a mesh shape.

19. The organic light-emitting display device of claim 12, wherein the black matrix completely overlaps the first sensing lines.

20. The organic light-emitting display device of claim 12, wherein the encapsulation layer comprises at least one of an organic layer and at least one of an inorganic layer.

21. The organic light-emitting display device of claim 12, wherein the display panel further comprises an organic light-emitting layer on the exposed portion of the first openings, and wherein an angle between a first imaginary line connecting one side of the organic light-emitting layer and one side of the second openings in the black matrix and a second imaginary line extending vertically from the surface of the substrate is 45°.

22. The organic light-emitting display device of claim 12, wherein the first regions overlap the black matrix.

* * * * *